US011276556B2

(12) United States Patent
Neal et al.

(10) Patent No.: US 11,276,556 B2
(45) Date of Patent: Mar. 15, 2022

(54) FIXTURE FOR VAPOR DEPOSITION SYSTEM

(71) Applicant: United Technologies Corporation, Farmington, CT (US)

(72) Inventors: James W. Neal, Jupiter, FL (US); Michael J. Maloney, Marlborough, CT (US); Kevin W. Schlichting, South Glastonbury, CT (US); David A. Litton, West Hartford, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 52 days.

(21) Appl. No.: 16/836,337

(22) Filed: Mar. 31, 2020

(65) Prior Publication Data

US 2020/0227234 A1 Jul. 16, 2020

Related U.S. Application Data

(62) Division of application No. 15/426,331, filed on Feb. 7, 2017, now Pat. No. 10,643,821.

(51) Int. Cl.
*H01J 37/30* (2006.01)
*G01K 1/14* (2021.01)
(Continued)

(52) U.S. Cl.
CPC ........ *H01J 37/3005* (2013.01); *C23C 14/243* (2013.01); *C23C 14/505* (2013.01);
(Continued)

(58) Field of Classification Search
CPC ............... H01J 37/3005; H01J 37/3178; H01J 2237/2001; H01J 2237/20214;
(Continued)

(56) References Cited

U.S. PATENT DOCUMENTS 4,632,056 A    12/1986  Stitz et al.
8,662,746 B2   3/2014   Subramanian et al.
(Continued)

FOREIGN PATENT DOCUMENTS

DE    19701419 A1   7/1998
GB      813251 A    5/1959
(Continued)

OTHER PUBLICATIONS

Extended European Search Report for EP Application No. 18153317.5, dated Jun. 13, 2018, 9 Pages.
(Continued)

*Primary Examiner* — Lisa M Caputo
*Assistant Examiner* — Janice M Soto
(74) *Attorney, Agent, or Firm* — Kinney & Lange, P.A.

(57) ABSTRACT

A vapor deposition system fixture comprises an arm, a rake, a crown gear bearing assembly, a workpiece holder, a thermocouple, and a contact ring assembly. The crown gear bearing assembly is attached to and rotatably engaged with the rake and includes stationary portion and rotating portions. The workpiece holder is configured to rotate with the rotating portion. The thermocouple is configured to rotate with the workpiece holder. The contact ring assembly comprises a housing, a cover, first and second rotating contact rings, and first and second stationary contact rings. The housing is attached to at least one of the arm and the rake. The first and second rotating contact rings are electrically connected to the thermocouple. The first and second stationary contact rings surround the rotating ring. The first and second stationary contact rings are configured to receive an electrical signal from the first and second rotating contact rings.

3 Claims, 8 Drawing Sheets

(51) Int. Cl.
  *G01K 7/02*    (2021.01)
  *G01K 13/08*   (2006.01)
  *C23C 14/50*   (2006.01)
  *C23C 14/24*   (2006.01)
  *C23C 14/54*   (2006.01)
  *G01N 25/00*   (2006.01)
  *H01J 37/317*  (2006.01)
  *C23C 14/30*   (2006.01)

(52) U.S. Cl.
  CPC ............... *C23C 14/54* (2013.01); *G01K 1/14* (2013.01); *G01K 7/02* (2013.01); *G01K 13/08* (2013.01); *G01N 25/00* (2013.01); *H01J 37/3178* (2013.01); *C23C 14/30* (2013.01); *H01J 2237/2001* (2013.01); *H01J 2237/20214* (2013.01)

(58) Field of Classification Search
  CPC . G01K 13/08; G01K 1/14; G01K 7/02; C23C 14/505; C23C 14/243; C23C 14/54; C23C 14/30; G01N 25/00
  See application file for complete search history.

(56) References Cited

U.S. PATENT DOCUMENTS

| | | | |
|---|---|---|---|
| 9,429,483 | B2 | 8/2016 | Engelstad et al. |
| 9,464,350 | B2 | 10/2016 | Mullin et al. |
| 2005/0147753 | A1* | 7/2005 | Smith ............... C23C 14/243 427/249.1 |
| 2007/0141233 | A1 | 6/2007 | Schlichting |
| 2009/0000548 | A1 | 1/2009 | Sohda |
| 2010/0242841 | A1 | 9/2010 | Neal |
| 2015/0204665 | A1 | 7/2015 | Lee et al. |

FOREIGN PATENT DOCUMENTS

| | | | |
|---|---|---|---|
| GB | 1428703 A | 3/1976 | |
| WO | WO-2014144189 A1 * | 9/2014 | ........... C23C 14/246 |

OTHER PUBLICATIONS

Communication Pursuant to Article 94(3) EPC for EP Application No. 18153317.5, dated Mar. 11, 2020, 6 pages.

* cited by examiner

FIXTURE FOR VAPOR DEPOSITION SYSTEM

CROSS-REFERENCE TO RELATED APPLICATION(S)

This application is a divisional of U.S. application Ser. No. 15/426,331, filed Feb. 7, 2017, for "PART TEMPERATURE MEASUREMENT DEVICE" by J. Neal, M. Maloney, K. Schlichting, and D. Litton.

BACKGROUND

The disclosure relates generally to coating systems and methods, and more specifically to measuring a temperature of a workpiece in a coating system.

Electron Beam Physical Vapor Deposition ("EB-PVD") processes and system utilize a cloud of vaporized material which is solidified upon at least one workpiece surface in a deposition chamber. Vaporized material for deposition can be generated by energizing feedstock material which can be retained in a conductive crucible.

In EB-PVD systems, a coating is applied to the workpiece as the workpiece is rotated in a heated deposition chamber of the EB-PVD system. In existing EB-PVD systems, a temperature of the workpieces being coated is imperative in the application of the coating and is typically measured when the workpiece is not rotating. Non-rotating averaged workpiece temperatures, which are correlated to witness thermocouples not attached to the workpiece, poorly approximate the actual workpiece temperature under rotation at constant or variable speed.

SUMMARY

A system for measuring a temperature of a rotating workpiece comprises a deposition chamber, a crucible within the deposition chamber, an energy source, a drive system, a temperature sensor, first and second sensor wires, a dynamic electrical connection, and a control system. The crucible is configured to hold a deposition feedstock material. The energy source is configured to heat the deposition feedstock material in the crucible so as to evaporate the deposition feedstock material. The drive system includes a rotatable workpiece holder rotatably coupled to a stationary portion and that is configured to receive the workpiece and to rotate the workpiece proximate the crucible such that at least a portion of the evaporated deposition feedstock material can impinge the rotating workpiece. The temperature sensor is coupled to the rotatable workpiece holder and configured to contact and rotate with the workpiece held by the rotatable workpiece holder so as to sense the temperature of the workpiece during rotation and to generate a signal indicative of the sensed temperature. The first sensor wire and a second sensor wire are electrically connected to the temperature sensor. The dynamic electrical connection is configured to electrically communicate the signal indicative of the sensed temperature from the rotatable workpiece holder to the stationary portion. The control system is configured to measure, based on the electrically communicated signal indicative of the sensed temperature, the temperature of the workpiece during rotation.

A method of measuring temperature comprises attaching a temperature sensor to a workpiece at a first location. A portion of a fixture with the workpiece is inserted into a deposition chamber of a vapor deposition system. The vapor deposition system includes a crucible within the deposition chamber, an energy source, a drive system, a temperature sensor, first and second sensor wires, a dynamic electrical connection, a control system, and a contact ring assembly. The crucible is configured to hold a deposition feedstock material. The energy source is configured to heat the deposition feedstock material in the crucible so as to evaporate the deposition feedstock material. The drive system includes a rotatable workpiece holder rotatably coupled to a stationary portion and that is configured to receive the workpiece and to rotate the workpiece proximate the crucible such that at least a portion of the evaporated deposition feedstock material can impinge the rotating workpiece. The temperature sensor is coupled to the rotatable workpiece holder and configured to contact and rotate with the workpiece held by the rotatable workpiece holder so as to sense the temperature of the workpiece during rotation and to generate a signal indicative of the sensed temperature. The first sensor wire and a second sensor wire are electrically connected to the temperature sensor. The dynamic electrical connection is configured to electrically communicate the signal indicative of the sensed temperature from the rotatable workpiece holder to the stationary portion. The control system is configured to measure, based on the electrically communicated signal indicative of the sensed temperature, the temperature of the workpiece during rotation. The contact ring assembly comprises a housing, a cover, first and second rotating contact rings, and first and second stationary contact rings. The workpiece is rotated. A temperature of the workpiece is measured with the temperature sensor as the workpiece is rotated.

A fixture for an electron beam physical vapor deposition system comprises an arm, a rake extending from the arm, a crown gear bearing assembly, a workpiece holder, a thermocouple with a first sensor wire and a second sensor wire, and a contact ring assembly. The crown gear bearing assembly is attached to and rotatably engaged with the rake and includes a stationary portion and a rotating portion configured to rotate relative to the stationary portion. The workpiece holder is configured to retain the workpiece within the deposition chamber. The workpiece holder is attached to the rotating portion of the crown gear bearing assembly and is configured to rotate with the rotating portion of the crown gear bearing assembly relative to the stationary portion of the crown gear bearing assembly. The thermocouple is configured to rotate with the workpiece holder relative to the stationary portion of the crown gear bearing assembly. The contact ring assembly comprises a housing, a cover, first and second rotating contact rings, and first and second stationary contact rings. The housing is attached to at least one of the arm and the rake. The cover is attached to the rotating portion of the crown gear bearing assembly. The first and second rotating contact rings are attached to the cover and electrically connected to the thermocouple. The first and second stationary contact rings are disposed in the housing and surrounding the rotating ring. The first and second stationary contact rings are configured to receive an electrical signal from the first and second rotating contact rings, respectively. The first and second rotating contact rings and the first and second stationary contact rings comprise a slip-ring configuration.

DETAILED DESCRIPTION

Figure 1:
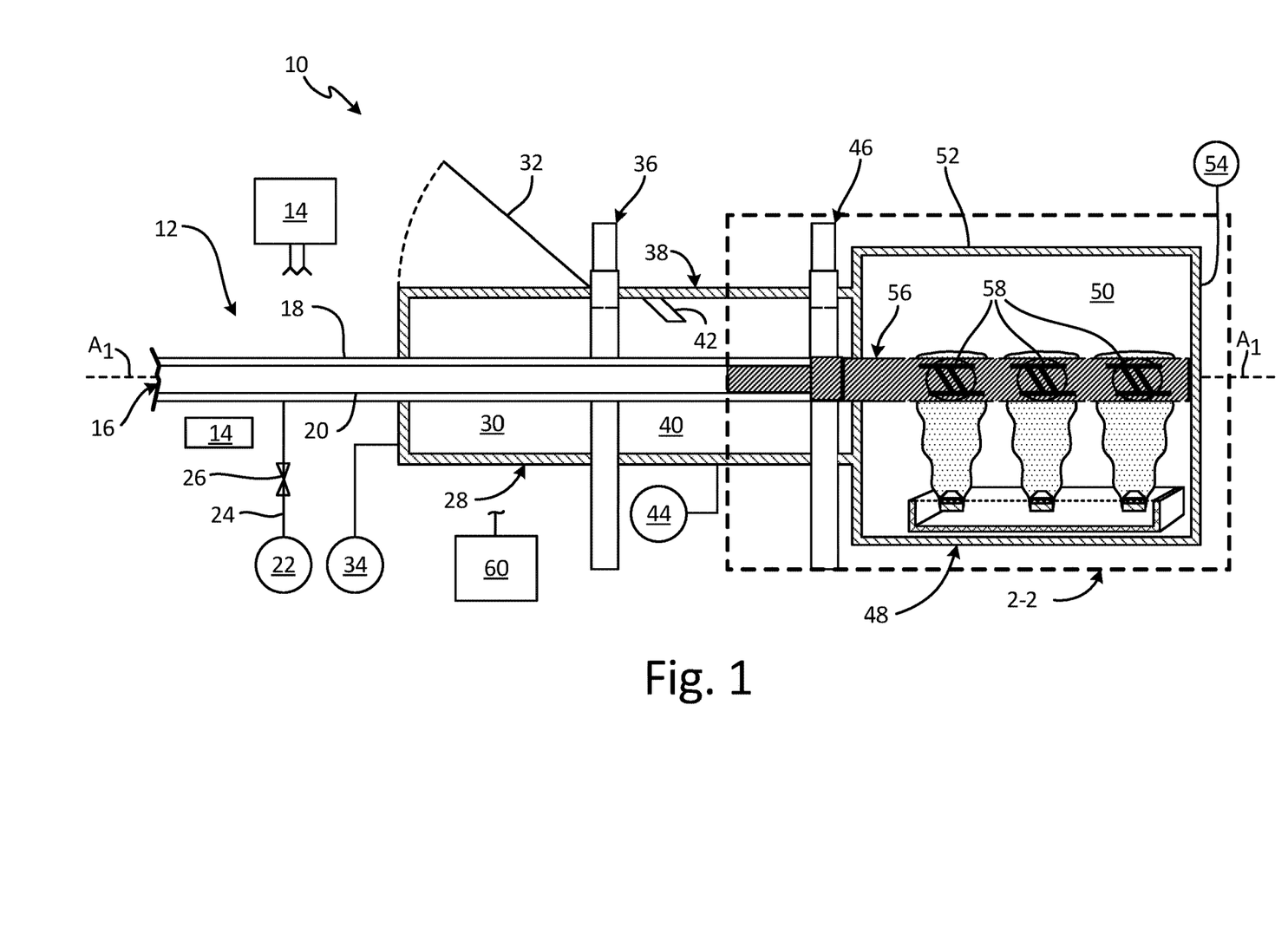
FIG. 1 is a schematic cross-sectional view of a coating system.

FIG. 1 is a schematic cross-sectional view of coating system 10 including drive system 12 (with drive mechanism 14 and sting assembly 16 including outer member 18 and inner member 20), gas source 22, gas line 24, gas valve 26, load/lock chamber 28 (with interior 30, loading door 32, and first vacuum port 34), first gate valve 36, preheat chamber 38 (with interior 40, workpiece preheater 42, and second vacuum port 44), second gate valve 46, deposition chamber 48 (with interior 50, chamber walls 52, and third vacuum port 54), fixture 56, workpieces 58, and control system 60.

Coating system 10 is a system for coating workpieces 58. In one non-limiting embodiment, coating system 10 can include an EB-PVD system or any other type of deposition or coating system. Drive system 12 includes drive mechanism 14 and sting assembly 16 and is configured to transfer workpieces 58 within the various chambers of coating system 10 and positioning workpieces 58 in deposition chamber 48 for workpieces 58 to receive a coating. Drive mechanism 14 is an actuator configured to longitudinally shift sting assembly 16 and fixture 56 into and out of load/lock chamber 28, preheat chamber 38, and deposition chamber 48. Sting assembly 16 is an assembly of outer member 18 and inner member 20 and is configured to rotate outer member 18 and inner member 20. Outer member 18 and inner member 20 are hollow shafts.

Gas source 22 is a source of a gas. In one non-limiting embodiment, the gas supplied by gas source 22 can include a reactive gas such as oxygen for combining with the initially vaporized material in vapor clouds to make up for oxygen lost from evaporated feedstock. Gas line 24 is a line for transferring the gas from gas source 22 to sting assembly 16. Gas valve 26 is a valve for controlling the rate of flow of the gas through gas line 24.

Load/lock chamber 28 is a chamber of coating system 10 within which workpieces are loaded onto fixture 56. Interior 30 is a compartment within load/lock chamber 28. Loading door 32 is a door configured to create an opening along a wall of load/lock chamber 28 to allow items to be transferred into and/or out of load/lock chamber 28. Load/lock chamber 28 can have one or more loading doors 48. First vacuum port 34 is a port for controlling a pressure within load/lock chamber 28. In one non-limiting embodiment, first vacuum port 34 can include one or more pumps with associated conduits and valves. First gate valve 36 is a gate for permitting or preventing insertion of fixture 56 from load/lock chamber 28 to preheat chamber 38.

Preheat chamber 38 is a chamber of coating system 10 within which a temperature of workpieces 58 is raised (or lowered) to a desired value before entering into deposition chamber 48. Interior 40 is a compartment within preheat chamber 38. Workpiece preheater 42 is any suitable thermal device capable of providing heating such as conductive or radiative heating such as an electron beam gun. In one non-limiting embodiment, workpiece preheater 42 can include a graphite heating element. Second vacuum port 44 is a port for controlling a pressure within preheat chamber 38. In one non-limiting embodiment, second vacuum port 44 can include one or more pumps with associated conduits and valves. Second gate valve 46 is a gate for permitting or preventing insertion of fixture 56 from preheat chamber 38 to deposition chamber 48.

Deposition chamber 48 is a chamber of coating system 10 within which workpieces 58 (are optionally brought to a final coating temperature and) are coated. Interior 50 is a compartment within deposition chamber 48. Chamber walls 52 are walls of deposition chamber 48. Third vacuum port 54 is a port for controlling a pressure within deposition chamber 48. In one non-limiting embodiment, third vacuum port 54 can include one or more pumps with associated conduits and valves.

Fixture 56 is a holding assembly configured to mount workpieces 58 onto. While only one fixture 56 is shown, there can be more than one fixture 56. In one non-limiting embodiment, fixture 56 is rotatable about at least one longitudinal axis (e.g., longitudinal horizontal axis Ai) in response to various manual or automated commands, such as from control system 60. Workpieces 58 are pieces of material to be coated by coating system 10. In one non-limiting embodiment, workpieces 58 can include blades, vanes, or other turbine engine components upon which a coating is to be deposited. For purposes of this disclosure, note that description of separate workpieces can encompass not only workpieces which are completely physically separate from one another (e.g., individual turbine blades or vanes), but also distinct sections of a single integrated workpiece. In one non-limiting example, an airfoil section and root section of a turbine blade or vane can be considered separate workpieces, as can first and second airfoils of a vane doublet. Control system 60 is a microcomputer, microcontroller, or other controller being configured by software and/or hardware to perform the functions described herein.

Drive system 12 is connected to fixture 56 via drive mechanism 14 and sting assembly 16 with outer member 18 and inner member 20. Drive mechanism 14 is mounted to outer member 18. In one non-limiting embodiment, drive mechanism 14 can include a screw drive mechanism (e.g., electric motor driven) or other suitable construction for longitudinally shifting sting assembly 16 and fixture 56 into and out of coating system 10. In other non-limiting embodiments, drive mechanism 14 can be part of a robotic system tailored for automated loading and unloading of workpieces 58 into the load/lock chamber 28, preheat chamber 38, and deposition chamber 48. Inner member 20 is disposed partially concentrically within outer member 18.

Gas source 22 is connected to an outlet (e.g., a manifold in deposition chamber 48, omitted for clarity) via gas line 24 and controlled by gas valve 26. In one non-limiting embodiment, gas line 24 is connected to one or more extensions through sting assembly 16 to an outlet/manifold in deposition chamber 48 or can be routed differently to provide reactive gas if and when it is needed for deposition. Gas valve 26 is physically attached and fluidly connected to gas line 24.

Load/lock chamber 28 is connected to preheat chamber 38 and to first gate valve 36. First vacuum port 34 is fluidly connected to and associated with load/lock chamber 28. Interior 30 is contained within load/lock chamber 28. Loading door 32 is rotatably attached to a sidewall of load/lock chamber 28. For purposes of schematic illustration, loading door 32 is shown in FIG. 1 as being positioned to close an opening or port at the top of load/lock chamber 28. In other non-limiting embodiments, loading door(s) 48 can be positioned at one or both sides of load/lock chamber 28, or below. First vacuum port 34 extends through a sidewall of load/lock chamber 28 and is fluidly connected with interior 30. First gate valve 36 is connected to and separates load/lock chamber 28 and preheat chamber 38. First gate valve 36 also connects interior 30 of load/lock chamber 28 with interior 30 of preheat chamber 38.

Preheat chamber 38 is connected to load/lock chamber 28 and to deposition chamber 48. Interior 40 is contained within preheat chamber 38. Workpiece preheater 42 is inserted into preheat chamber 38 and is fluidly connected to interior 40. Second vacuum port 44 extends through a sidewall of preheat chamber 38 and is fluidly connected with interior 40. First gate valve 36 is disposed at one end of preheat chamber 38, i.e., between interior 40 of preheat chamber 38 and interior 30 of load/lock chamber 28. Second gate valve 46 is disposed at an opposing end of preheat chamber 38 between interior 40 of preheat chamber 38 and interior 50 of deposition chamber 48. In other non-limiting embodiments, each of the first gate valve 36 and second gate valve 46 can be replaced by two or more valves so as to allow further isolation of load/lock chamber 28, preheat chamber 38, and/or deposition chamber 48 or to allow various alternative couplings of multiple load/lock chambers 28, preheat chambers 38, and/deposition chambers 48.

Deposition chamber 48 is connected to preheat chamber 38. Interior 50 is contained within deposition chamber 48. Chamber walls 52 surround interior 50 of deposition chamber 48. Third vacuum port 54 is fluidly connected to and associated with deposition chamber 48. Third vacuum port 54 extends through one of a plurality of chamber walls 52. Fixture 56 are attached to outer member 18 and inner member 20 of sting assembly 16. Workpieces 58 are mounted onto a portion of fixture 56.

Control system 60 is in communication (wired and/or wirelessly) to various controllable system components as well as to sensors, input devices for receiving user input, and display devices (not shown for clarity). In one non-limiting embodiment, control system 60 is configured to measure, based on an electrically communicated signal indicative of a sensed temperature of workpieces 58, the temperature of workpieces 58 during rotation.

In general, coating system 10 functions so as to apply a coating to workpieces 58. In one non-limiting embodiment, coating system 10 is used to apply an EB-PVD coating onto workpieces 58.

Drive system 12 is driven by drive mechanism 14 to actuate sting assembly 16 and fixture 56 with workpieces 58 into and out of load/lock chamber 28, preheat chamber 38, and deposition chamber 48. Drive mechanism 14 (e.g., an actuator) is operable to drive sting assembly 16 in one or more directions. Drive mechanism 14 is mounted to outer member 18 to longitudinally shift outer member 18 (and thereby inner member 20). Drive mechanism 14 is also configured to rotate inner member 20 relative to outer member 18 about axis Ai.

In one non-limiting embodiment, the reactive gas supplied by gas source 22, such as oxygen, is supplied for combining with the initially vaporized material in the vapor clouds to make up for oxygen lost from the evaporated ceramic material from feedstock used in coating system 10.

Load/lock chamber 28 is used as a staging area for mounting workpieces 58 onto fixture 56. In other non-limiting embodiments, load/lock chamber 28 is used as a transfer chamber for staging or other interim processing and preparation steps. Loading door 32 is used to provide access for tooling or for adding or removing parts and/or components in to and out of interior 30 of load/lock chamber 28. First vacuum port 34 is used to control the pressure within interior 30 of load/lock chamber 28 by increasing or decreasing the vacuum force through first vacuum port 34.

First gate valve 36 is used to open and close a connection between interior 30 of load/lock chamber 28 and interior 40 of preheat chamber 38. Second gate valve 46 is used to open and close a connection between interior 40 of preheat chamber 38 and interior 50 of deposition chamber 48. When the appropriate first and second gate valves 38 and 44 are open, drive system 12 shifts workpieces 58 into preheat chamber 38, or all the way into deposition chamber 48. First and second gate valves 38 and 44 also prevent the transfer of thermal energy between deposition chamber 48, preheat chamber 38, and load/lock chamber 28.

In operation of coating system 10, fixture 56 is inserted into load/lock chamber 28 where workpieces 58 are mounted onto fixture 56. Once all of workpieces 58 are mounted onto fixture 56, first gate valve 38 is opened and fixture 56 with workpieces 58 are inserted into preheat chamber 38. In preheat chamber 38, a temperature within interior 40 is heated by workpiece preheater 42 so as to increase the temperature of workpieces 58. In other non-limiting embodiments, preheat chamber 38 can serve as a transfer chamber for staging or other interim processing and preparation steps. After the temperature of workpieces 58 has increased to a desired amount, second gate valve 46 is opened and fixture with workpieces 58 is shifted into deposition chamber 48. Further processing of workpieces 58 is discussed with respect to FIGS. 2-5C.

Figure 2:
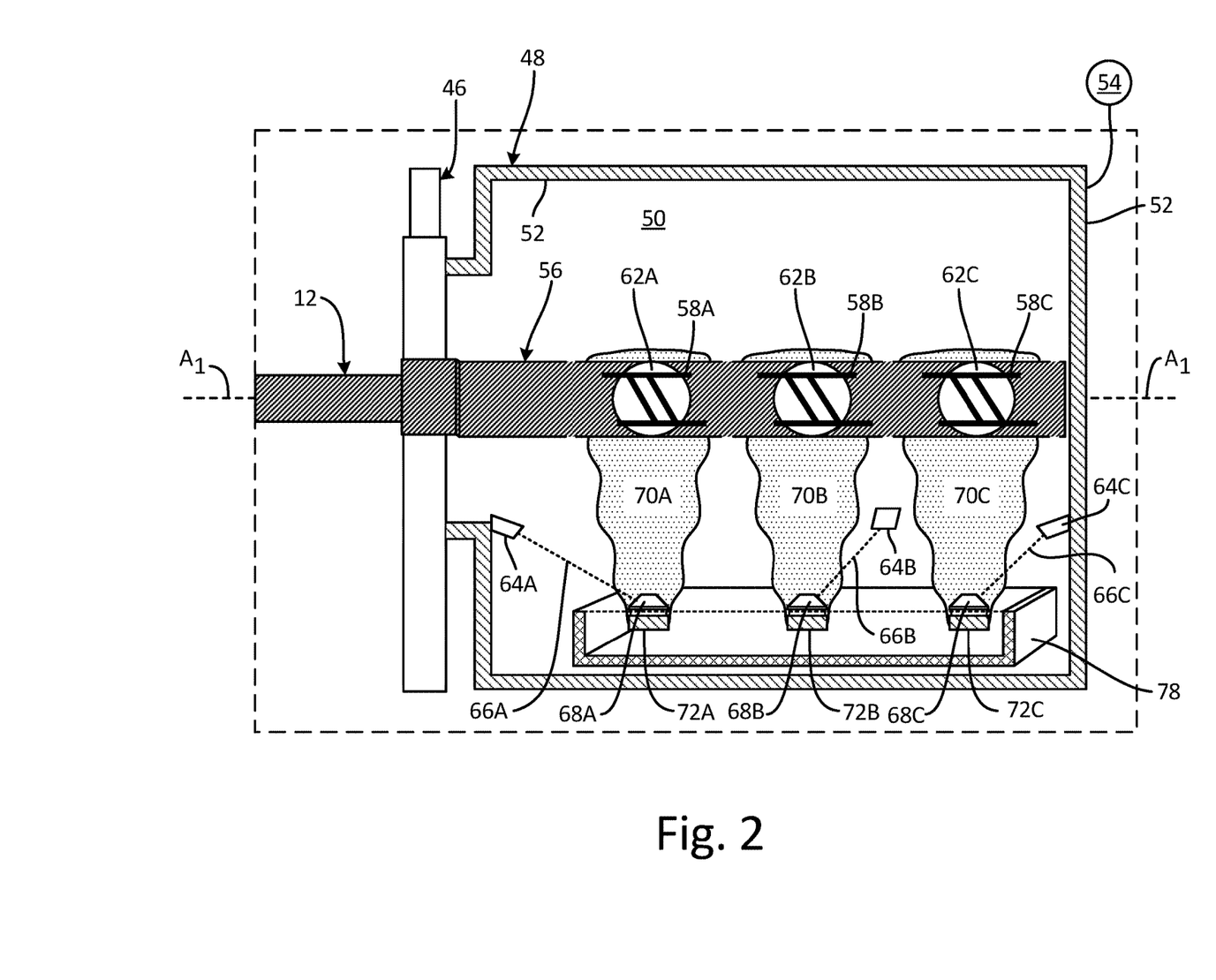
FIG. 2 is a cross-section view of a deposition chamber portion of the coating system in use taken along 2-2 in FIG. 1.
Figure 3:
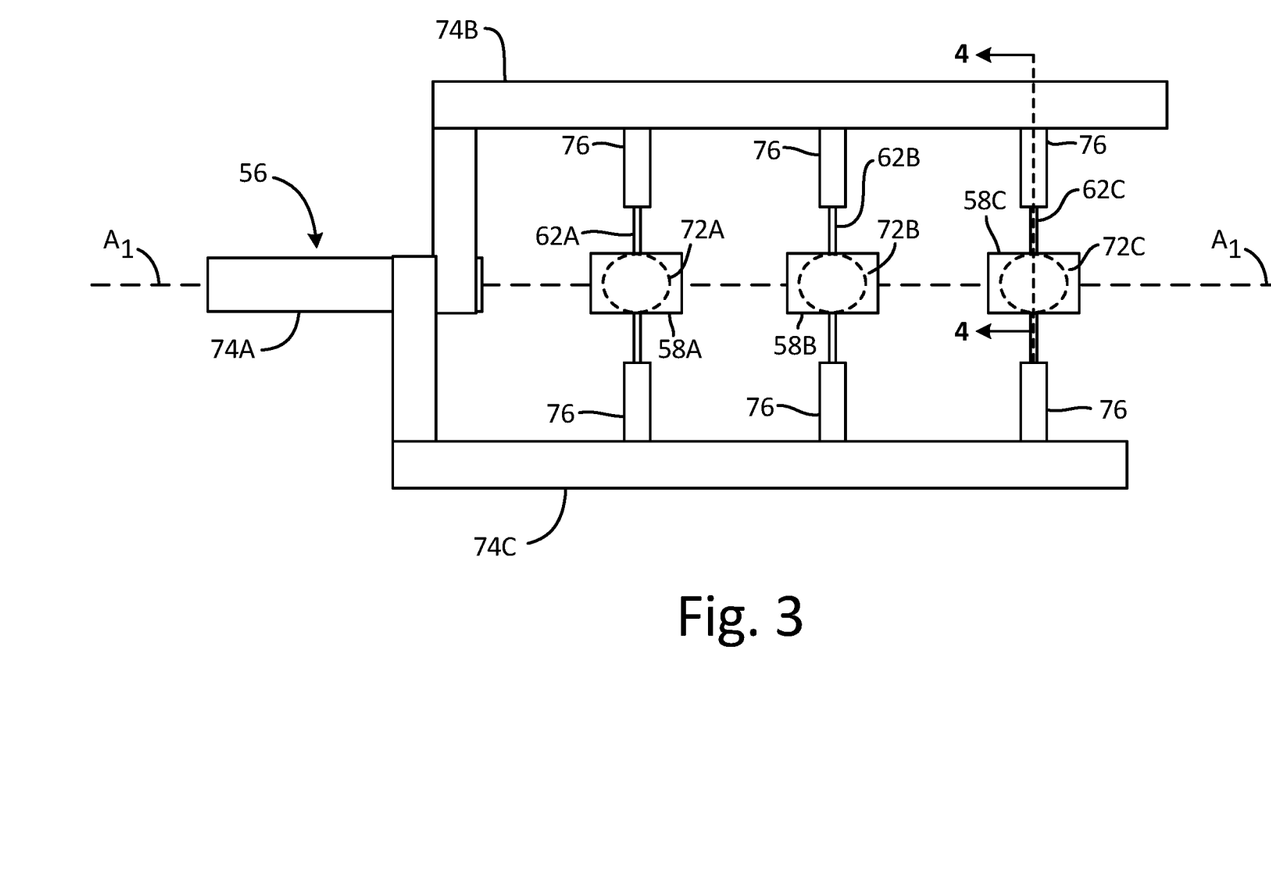
FIG. 3 is a top view of a fixture for use in the deposition chamber.

FIG. 2 shows a cross-section view of fixture 56 with workpieces 58A, 58B, and 58C in deposition chamber 48. FIG. 3 shows a top view of fixture 56 with workpieces 58A, 58B, and 58C. FIGS. 2 and 3 will be discussed together. In addition to the elements discussed with respect to FIG. 1, FIG. 2 shows first workpiece holder 62A, second workpiece holder 62B, third workpiece holder 62C, energy sources 64A, 64B, and 64C, vaporization energies 66A, 66B, and 66C, feedstock materials 68A, 68B, and 68C, vapor plumes 70A, 70B, and 70C, and crucibles 72A, 72B, and 72C. FIG. 3 additionally shows first arm 74A, second arm 74B, third arm 74C, rakes 76, and magazine 78.

First workpiece holder 62A, second workpiece holder 62B, and third workpiece holder 62C are rotatable shafts configured to retain respective workpieces 58A, 58B, and 58C.

Energy sources 64A, 64B, and 64C are configured to selectively apply and direct energy within deposition chamber 48. Energy sources 64A, 64B, and 64C are devices which emit energy into deposition chamber 48. In one non-limiting embodiment, energy sources 64A, 64B, and 64C are electron beam guns that direct vaporization energy. Vaporization energies 66A, 66B, and 66C are energy used to energize feedstock materials 68A, 68B, and 68C, respectively within deposition chamber 48.

Feedstock materials 68A, 68B, and 68C are feedstock ingot used to create the coatings applied to workpieces 58A, 58B, and 58C, respectively. In one non-limiting embodiment, feedstock materials 68A, 68B, and 68C can either be of similar form to a desired coating material, or it can be a precursor combinable with a carrier of mixing gas (e.g., oxygen) to form a desired chemistry under system operating conditions. Vapor plumes 70A, 70B, and 70C are vapor clouds or plumes or vaporized feedstock materials 68A, 68B, and 68C, respectively. Crucibles 72A, 72B, and 72C are receptacles configured to hold feedstock materials 68A, 68B, and 68C, respectively during a vapor deposition process performed by coating system 10.

In one non-limiting embodiment, the material of crucibles 72A, 72B, and 72C can be inert to the vaporization energy in that crucibles 72A, 72B, and 72C can provide thermal and electrical conduction to facilitate vapor formation from feedstock materials 68A, 68B, and 68C while remaining structurally intact and substantially phase stable during the coating process to prevent coating contamination. In other non-limiting embodiments, crucibles 72A, 72B, and 72C can be configured with various means to prevent melting by the applied vaporization energy from one or more sources (e.g., energy sources 64A, 64B, and 64C shown in FIG. 2). Magazine 78 is a tray or holder configured to retain crucibles 72A, 72B, and 72C.

First, second, and third workpiece holders 62A, 62B, and 62C are rotatably attached to rakes 76 of fixture 56. (See e.g., FIG. 4). Energy sources 64A, 64B, and 64C are attached to chamber walls 52 of deposition chamber 48. Vaporization energies 66A, 66B, and 66C are emitted from energy sources 64A, 64B, and 64C, respectively and heat feedstock materials 68A, 68B, and 68C in crucibles 72A, 72B, and 72C so as to evaporate feedstock materials 68A, 68B, and 68C. Feedstock materials 68A, 68B, and 68C are held within crucibles 72A, 72B, and 72C. Vapor plumes 70A, 70B, and 70C emanate upwards from respective feedstock materials 68A, 68B, and 68C and impinge onto workpieces 58A, 58B, and 58C, respectively. Crucibles 72A, 72B, and 72C are connected and attached to magazine 78.

Magazine 78 is detachably connected to one of chamber walls 52 of deposition chamber 48. In one non-limiting embodiment, magazine 78 can also allow (e.g., via communication with control system 60, shown in FIG. 1) manual or automated positioning of crucibles 72A, 72B, and 72C so that the resulting vapor plumes 70A, 70B, and 70C are in selective or constant communication with respective workpieces 58A, 58B, and 58C during a coating run. In another non-limiting embodiment, each of crucibles 72A, 72B, and 72C can be provided with the same or different feedstock compositions and can be arranged in such a way so as to allow multiple coating layers of different chemistries onto workpieces 58A, 58B, and 58C.

Second arm 74B and third arm 74C are connected to and extend laterally from first arm 74A. First arm 74A, second arm 74B, and third arm 74C are disposed on an end of drive system 12. Arms 74A, 74B, and 74C, one or more of which can be motorized, are configured (e.g., with rakes 76) to manipulate at least one of workpiece holders 62A, 62B, and 62C so as to expose different portions of workpieces 58A, 58B, and 58C to vapor plumes 70A, 70B, and 70C. Rakes 76 are mounted separately onto second arm 74B and third arm 74C. Rakes extend partially between second arm 74B and third arm 74C, and with workpiece holders 62A, 62B, and 62C span the distance between second arm 74B and third arm 74C.

With deposition chamber 48 and workpieces 58A, 58B, and 58C at a desirable temperature, the process of coating workpieces 58A, 58B, and 58C begins. Energy sources 64A, 64B, and 64C (e.g., electron beam guns) direct vaporization energy 66A, 66B, and 66C toward crucibles 72A, 72B, and 72C for energizing feedstock materials 68A, 68B, and 68C retained therein and generating corresponding vapor clouds or plumes 70A, 70B, and 70C. In one non-limiting embodiment, energy sources 64A, 64B, and 64C that vaporize feedstock materials 68A, 68B, and 68C can be used to heat deposition chamber 48 (e.g., by directing vaporization energy 66A, 66B, and 66C to a bed of refractory ceramic gravel, omitted for clarity). In this manner, vaporization energy 66A, 66B, and 66C can provide a preheating of the deposition chamber 48 (e.g., both before and between coating runs).

As plumes 70A, 70B, and 70C are emitted in an upwards direction from feedstock materials 68A, 68B, and 68C, the vapor from plumes 70A, 70B, and 70C is deposited onto workpieces 58A, 58B, and 58C. As plumes 70A, 70B, and 70C are depositing material onto workpieces 58A, 58B, and 58C, workpieces 58A, 58B, and 58C are being rotated relative to rakes 76 so as to allow for a particular application pattern of the coating material onto workpieces 58A, 58B, and 58C. As plumes 70A, 70B, and 70C are depositing the coating material onto workpieces 58A, 58B, and 58C, the temperature of workpieces 58A, 58B, and 58C has a significant effect on the behavior of the coating material and the microstructure of the resultant coatings.

In existing EB-PVD systems, a temperature of the workpieces being coated is typically measured when the workpiece is not rotating. Non-rotating averaged workpiece temperatures, which are often correlated to witness thermocouples not attached to the workpiece, poorly approximate the actual workpiece temperature under rotation at constant or variable speed.

Figure 4:
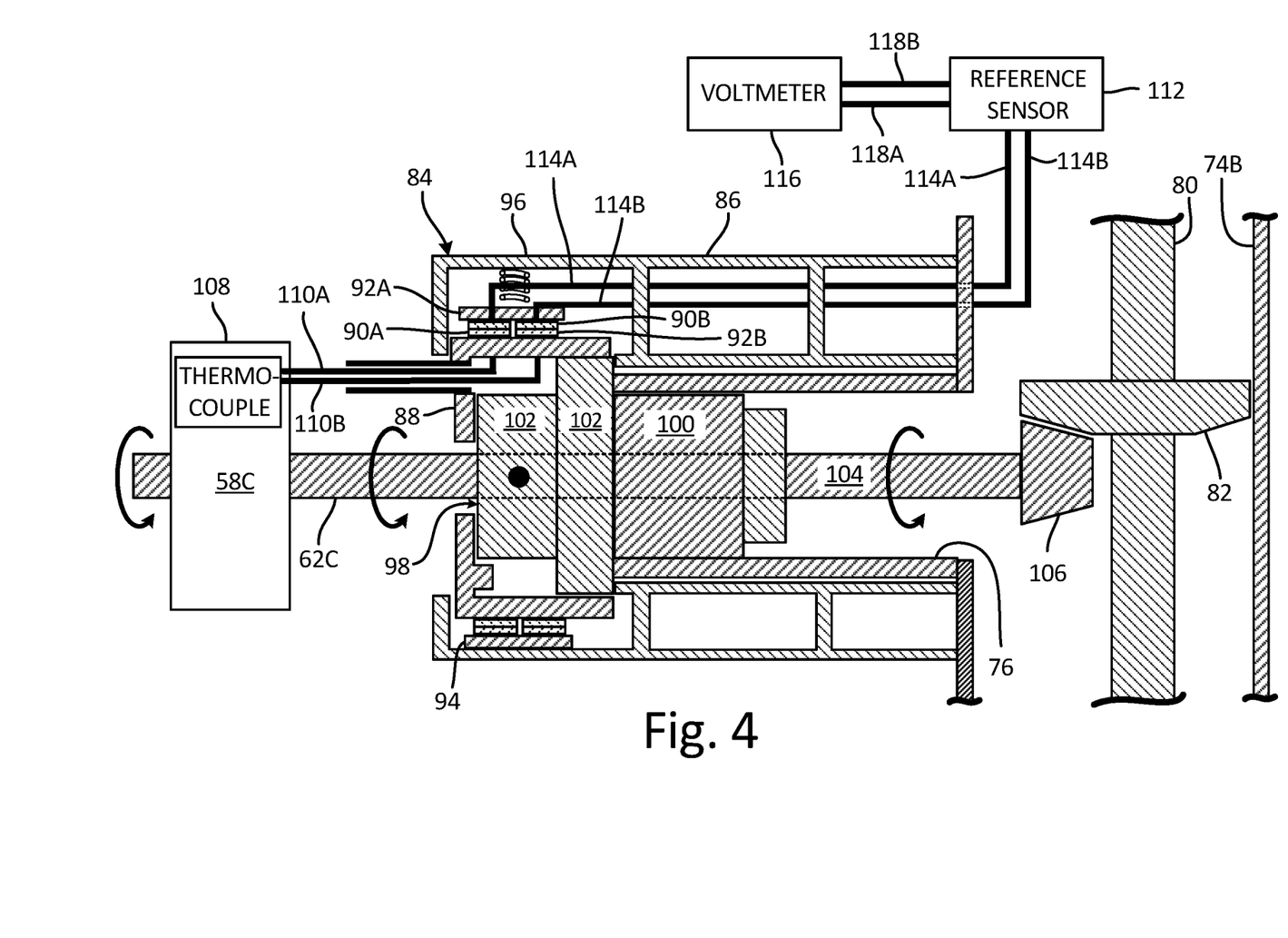
FIG. 4 is cross sectional view of a contact ring assembly, a rake arm of the fixture, and a temperature sensor taken along 4-4 in FIG. 3.

FIG. 4 shows a cross sectional view of fixture 56 with workpiece 58C taken along 4-4 of FIG. 3, with workpiece 58C shown not in cross-section for clarity. In addition to workpiece holder 62C, third workpiece holder 62C, second arm 74B, and rake 76 discussed with respect to FIGS. 1-3, FIG. 4 also shows gear shaft 80 with gear head 82 of second arm 74B, contact ring assembly 84 (including housing 86, cover 88, rotating contact rings 90A and 90B, stationary contact rings 92A and 92B, containment ring 94, and resilient element 96), crown gear bearing assembly 98 (including stationary portion 100, rotating portion 102, and rotating shaft 104 with gear head 106), temperature sensor 108, first sensor wire 110A, second sensor wire 110B, reference sensor 112, first reference wire 114A, second reference wire 114B, voltmeter 116, first lead wire 118A, and second lead wire 118B. Temperature sensor 108, reference sensor 112, and voltmeter 116 are shown in block diagram form in FIG. 4.

Gear shaft 80 is a rotating shaft with a plurality of gears. Gear 82 is a gear with cogs or a worm (e.g., a gear in the form of a screw) configured to engage with gear 106 of crown gear bearing assembly 98. In one non-limiting embodiment, gear 82 can include a bevel gear.

Contact ring assembly 84 is a slip-ring assembly configured to transmit electrical signals (e.g., thermocouple voltage) between rotating contacts rings 90A and 90B and stationary contact rings 92A and 92B. Contact ring assembly 84 is a dynamic electrical connection configured to electrically communicate a signal indicative of the sensed temperature from workpiece holder 62C to stationary portion 100.

Housing 86 is a generally cylindrical casing configured to house cover 88, rotating contacts rings 90A and 90B, stationary contact rings 92A and 92B, containment ring 94, and resilient element 96. Cover 88 is a cap configured to be placed onto rotating portion 102 of crown gear bearing assembly 98. Rotating contacts rings 90A and 90B are rotating rings of contact ring assembly 84. In one non-limiting embodiment, rotating contact ring 90A includes an alloy made of approximately 90 percent nickel and 10 percent chromium and rotating contact ring 90B includes an alloy consisting of approximately 95% nickel, 2% manganese, 2% aluminum and 1% silicon so as to match the materials of temperature sensor 108 for a type-K thermocouple. In other non-limiting embodiments, materials of rotating contacts rings 90A and 90B can include materials corresponding with a type of thermocouple used for temperature sensor 108, such as for example a type-M, or type-N nickel-alloy thermocouple, or a type-B, type-R, or type-S platinum thermocouple.

Stationary contact rings 92A and 92B are rings of solid material that remain stationary relative to rotating connect rings 90A and 90B. In one non-limiting embodiment, stationary contact rings 92A and 92B are the same materials as rotating contacts rings 90A and 90B, respectively. In another non-limiting embodiment, stationary contact ring 92A includes an alloy made of approximately 90 percent nickel and 10 percent chromium and stationary contact ring 92B includes an alloy consisting of approximately 95% nickel, 2% manganese, 2% aluminum and 1% silicon so as to match the materials of temperature sensor 108 for a type-K thermocouple. In other non-limiting embodiments, materials of stationary contacts rings 92A and 92B can include materials corresponding with a type of thermocouple used for temperature sensor 108, such as for example a type-M, or type-N nickel-alloy thermocouple, or a type-B, type-R, or type-S platinum thermocouple.

Containment ring 94 is an annular ring configured to contain stationary contact rings 92A and 92B and bias stationary contact rings 92A and 92B against rotating contact rings 90A and 90B, respectively. Resilient element 96 is a spring, coil, or another type of spring-loaded device. In other non-limiting embodiments, resilient element 96 can include a plurality of arcuate or non-arcuate spring load devices.

Crown gear bearing assembly 98 is a gear assembly with a crown gear such as a bevel gear with a pitch cone angle of 90°. Stationary portion 100 is an annular ring of solid material within crown gear bearing assembly 98. Rotating portion 102 is a disk or annual ring of solid material. Rotating shaft 104 is shaft of solid material configured to rotate within rake 76. Gear 106 is a gear with cogs or a worm gear configured to engage with gear 82 of gear shaft 80.

Temperature sensor 108 is a sensor configured to measure temperature. Temperature sensor 108 is any of a variety of temperature sensors configured to electronically measure temperature, such as a thermocouple or resistance temperature detector ("RTD"). In one non-limiting embodiment, temperature sensor 108 can be a thermocouple which is a device producing a temperature dependent voltage. The thermocouple can include a type-K, type-M, or type-N nickel-alloy thermocouple, or a type-B, type-R, or type-S platinum thermocouple. As a thermocouple, the temperature dependent voltage is measured by voltmeter 116 in reference to a reference temperature measured by reference sensor 112.

In another non-limiting embodiment, temperature sensor 108 can be a RTD which is a device having a temperature dependent resistance. With a typical RTD, a transmitter injects a current into the RTD, and the resultant voltage across the RTD is a measure of resistance and thus temperature. The voltage is converted into a digital format using an analog-to-digital converter and provided to measurement circuitry. Measurement circuitry converts the measured voltage into a digital value representative of temperature that a user is able to observe.

First sensor wire 110A and second sensor wire 110B are wires configured to transmit electrical signals. In one non-limiting embodiment, first sensor wire 110A and second sensor wire 110B include the same materials as rotating contacts rings 90A and 90B, respectively. In another non-limiting embodiment, first sensor wire 110A includes an alloy made of approximately 90 percent nickel and 10 percent chromium and second sensor wire 110B includes an alloy consisting of approximately 95% nickel, 2% manganese, 2% aluminum and 1% silicon so as to match the materials of temperature sensor 108 for a type-K thermocouple.

Reference sensor 112 is a sensor configured to measure temperature such as a reference temperature for use with temperature sensor 108. In one non-limiting embodiment, reference sensor 112 is a reference juncture, or junction, (sensor) used with a thermocouple. Reference sensor 112 can be calibrated independently of, and prior to connecting to, temperature sensor 108. In another non-limiting embodiment, reference sensor 112 can be a reference calibration tool that generates a measurable electrical parameter with a predetermined value. In another non-limiting embodiment, reference sensor 112 can generate a predetermined voltage in order to simulate a particular type of thermocouple measuring a specific reference temperature. In another non-limiting embodiment, reference sensor 112 can generate a predetermined electrical resistance in order to simulate a particular type of RTD measuring a specific reference temperature. In yet another non-limiting embodiment, a temperature at reference sensor 112 is controlled or independently measured.

First reference wire 114A and second reference wire 114B are wires configured to transmit electrical signals. In one non-limiting embodiment, first reference wire 114A and second reference wire 114B include the same material as first sensor wire 110A and second sensor wire 110B. In another non-limiting embodiment, first reference wire 114A includes an alloy made of approximately 90 percent nickel and 10 percent chromium and second reference wire 114B includes an alloy consisting of approximately 95% nickel, 2% manganese, 2% aluminum and 1% silicon so as to match the materials of temperature sensor 108 for a type-K thermocouple.

Voltmeter 116 is a device for measuring voltage. First lead wire 118A and second lead wire 118B are wires configured to transmit electrical signals. In one non-limiting embodiment, first lead wire 118A and second lead wire 118B are copper wires.

Third workpiece holder 62C is attached to rotating portion 102 of crown gear bearing assembly 98 such that third workpiece holder 62C rotates with rotating portion 102 relative to stationary portion 100 of crown gear bearing assembly 98. Gear shaft 80 is disposed within and rotates relative to second arm 74B. Gear 82 is attached to gear shaft 80 and disposed within second arm 74B. Gear 82 is rotationally engaged with gear 106 such that gear 106 is rotated as gear 82 is rotated.

Contact ring assembly 84 is attached onto and over rake 76. Housing 86 is clamped to rake 76. In one non-limiting embodiment, housing 86 is attached to second arm 74B. Cover 88 is pressed onto rotating portion 102 of crown gear bearing assembly 98 by housing 86. Cover 88 is engaged with rotating portion 102 of crown gear bearing assembly 98 such that cover 88 is stationary relative to rotating portion 102. Rotating contact rings 90A and 90B are affixed to a radially outer surface of cover 88. Rotating contact rings 90A and 90B are disposed radially within stationary contact rings 92A and 92B, respectively. Rotating contact rings 90A and 90B are electrically connected to temperature sensor 108 via first sensor wire 110A and second sensor wire 110B, respectively.

Stationary contact rings 92A and 92B are disposed within housing 86 and are stationary relative to housing 86 and rake 76. Stationary contact rings 92A and 92B are disposed radially outwards from, surround, and rotate relative to rotating contact rings 90A and 90B, respectively. Stationary contact rings 92A and 92B are disposed along a radially inward surface of containment ring 94. Stationary contact rings 92A and 92B are configured to receive an electrical signal from rotating contact rings 90A and 90B, respectively.

Containment ring 94 is connected to and contains stationary contact rings 92A and 92B. Containment ring 94 is spring-loaded via resilient element 96 to bias stationary contact rings 92A and 92B against rotating rings 90A and 90B, respectively during operation of crown gear bearing assembly 98. Resilient element 96 is disposed radially between an outer portion of housing 86 and containment ring 94. Resilient element 96 is spring-loaded (e.g., radially biased) against a radially inward surface of the outer portion of housing 86 and a radially outward surface of containment ring 94.

Crown gear bearing assembly 98 is connected to rake 76 via stationary portion 100. Stationary portion 100 is disposed within and affixed to rake 76. Rotating portion 102 is rotatably connected to stationary portion 100. Rotating shaft 104 is connected to rotating portion 102 and extends towards gear shaft 80 of second arm 62A. Gear 106 is affixed onto a distal end of rotating shaft 104 and engages with gear 82.

Temperature sensor 108 is removably attached to workpiece 58C such that temperature sensor 108 is in contact with a surface of workpiece 58C. Temperature sensor 108 is configured to rotate with third workpiece holder 62C relative to stationary portion 100 of crown gear bearing assembly 98. Temperature sensor 108 senses the temperature of workpiece 58C during rotation and generates a signal indicative of the sensed temperature. First sensor wire 110A and second sensor wire 110B electrically connect rotating contact rings 90A and 90B, respectively to temperature sensor 108. Reference sensor 112 is electrically connected to stationary contact rings 92A and 92B of contact ring assembly 84 via first and second reference wires 114A and 114B. In some non-limiting embodiments, reference sensor 112 can be located in a temperature controlled location or a location where the temperature is independently measured such as in deposition chamber 48 (e.g., along fixture 56 or chamber walls 52), in preheat chamber 38, in load/lock chamber 28, or externally from coating system 10. In one non-limiting embodiment, reference sensor 112 can be disposed in a juncture box positioned behind a center gear box for first arm 74A, second arm 74B, and third arm 74C. First and second reference wires 114A and 114B electrically connect stationary contact rings 92A and 92B with reference sensor 112. Voltmeter 116 is electrically connected to reference sensor 112 via first lead wire 118A and second lead wire 118B. In one non-limiting embodiment, voltmeter 116 is located in control system 60.

As gear shaft 80 of second arm 74B is rotatably driven (e.g., via drive system 12 of FIGS. 1-3), gear 82 rotates causing gear 106 of crown gear bearing assembly 98 to rotate. As gear 106 rotates, rotating shaft 104 is rotatably driven to rotate rotating portion 102. As rotating portion 102 rotates, third workpiece holder 62C rotates thereby rotating workpiece 58C. As workpiece 58C rotates, a temperature of workpiece 58C is measured with temperature sensor 12.

As a part of measuring the temperature of workpiece 58C with temperature sensor 108, a sensor electrical signal from temperature sensor 108 is relayed through first and second wires 110A and 110B to rotating contact rings 90A and 90B, respectively. The sensor electrical signal is transmitted from rotating contact rings 90A and 90B to stationary contact rings 92A and 92B, respectively as rotating contact rings 90A and 90B are rotating relative to stationary contact rings 92A and 92B. In other words, the sensor electrical signal is transferred across a rotating interface between rotating contact rings 90A and 90B and stationary contact rings 92A and 92B. The sensor electrical signal is received from rotating contact rings 90A and 90B with stationary contact rings 92A and 92B, respectively. The sensor electrical signal is relayed to a reference juncture (such as reference sensor 112), through first lead wire 118A and second lead wire 118B, and into voltmeter 116. A difference in voltage across first lead wire 118A and second lead wire 118B at voltmeter is measured by voltmeter 116.

The slip-ring configuration of contact ring assembly 84 allows temperature sensor 108 to be placed directly onto workpiece 58C and the transfer of electrical temperature signals to pass from rotating third workpiece holder 62C to non-rotating rake 76 and second arm 74B. Without the slip-ring configuration of contact ring assembly 84, sensor wires running from a rotating workpiece holder to a stationary rake arm would twist around the rake arm, get tangled, and fail. The slip-ring configuration of contact ring assembly 84 allows temperature measurements to be taken with temperature sensor 108 as workpiece 58C is spinning thereby reducing errors in temperature calculation as compared to non-rotating averaged workpiece temperatures. The ability to measure actual workpiece temperature during constant rpm or variable rpm process conditions prevents undesirable variations in coating microstructure such as for example from a columnar structure to a feathered structure.

Figure 5:
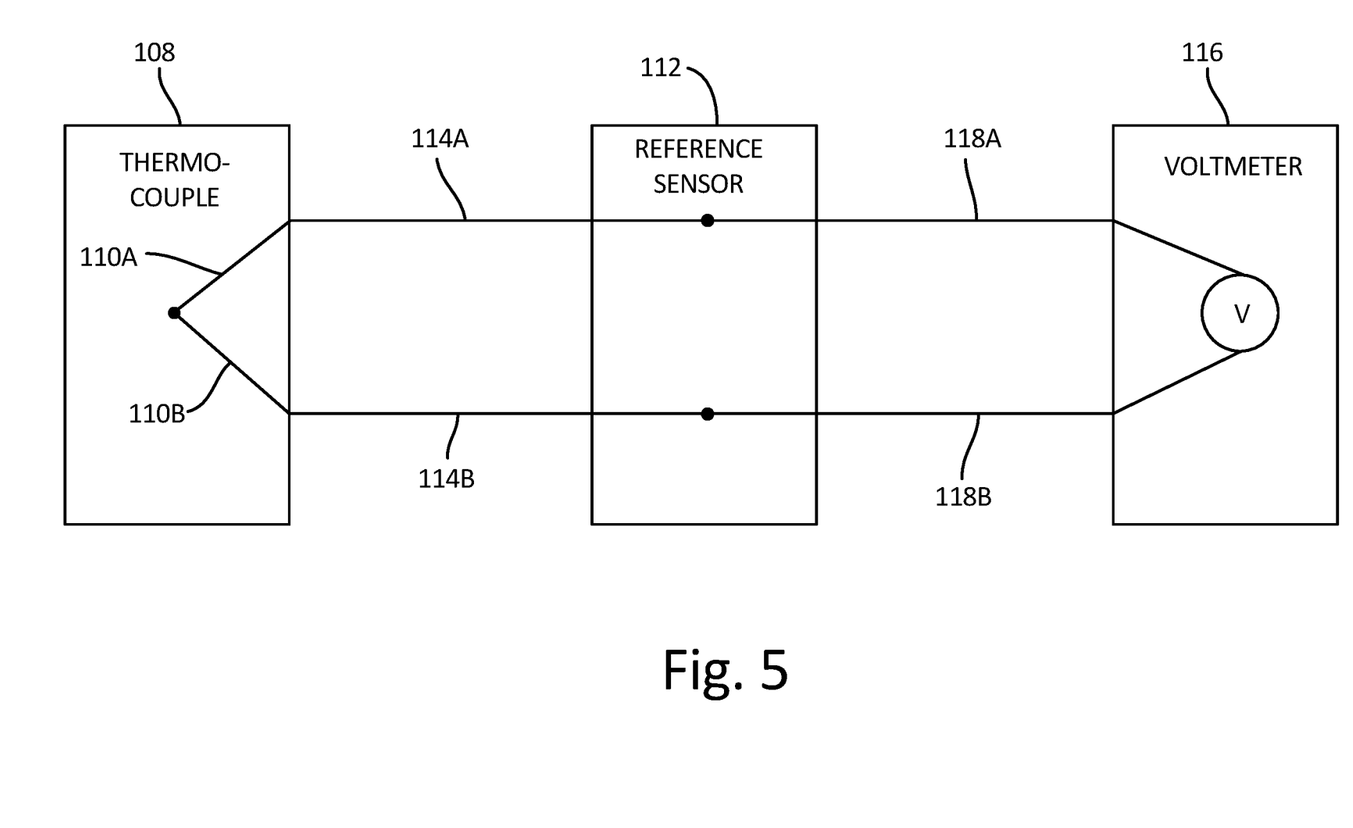
FIG. 5 is a block diagram of a temperature sensor, a reference sensor, and a voltmeter of the coating system.

FIG. 5 is a block diagram showing temperature sensor 108, first sensor wire 110A, second sensor wire 110B, reference sensor 112, first reference wire 114A, second reference wire 114B, voltmeter 116, first lead wire 118A, and second lead wire 118B. Workpiece 58C, rotating contact rings 90A and 90B, and stationary contact rings 92A and 92B have been omitted from FIG. 5 for clarity. In the following non-limiting embodiment, discussion of temperature sensor 108 includes the use of a thermocouple, however it should be understood that any other type of temperature sensor can be used for temperature sensor 108.

In operation, as the temperature of third workpiece 56A (FIG. 4) increases, a voltage is generated across first sensor wire 110A and second sensor wire 110B at temperature sensor 108 due to the magnetic field generated between first sensor wire 110A and second sensor wire 110B (which are made of different materials). As a result of the voltage generated across first sensor wire 110A and second sensor wire 110B at temperature sensor 108, a thermo-electric current is produced and is transmitted through first sensor wire 110A and second sensor wire 110B, through first reference wire 114A and second reference wire 114B, and to reference sensor 112. The thermo-electric current passes into reference sensor 112, out through first lead wire 118A and second lead wire 118, and into voltmeter 116. A voltage difference across first lead wire 118A and second lead wire 118 is measured at voltmeter 116.

The measured difference in voltage across first lead wire 118A and second lead wire 118B at voltmeter 116 is then used to obtain a difference in temperature between temperature sensor 108 and reference sensor 112. The difference in voltage across first lead wire 118A and second lead wire 118B at voltmeter 116 is proportional to the difference in temperature between temperature sensor 108 and reference sensor 112 according to Equation 1.1:

$$\{\nabla T = \nabla V/(-S(T))\} \qquad \text{Equation 1.1:}$$

where $\nabla T$ represents a gradient in temperature, $\nabla V$ represents a gradient in voltage, and $-S(T)$ represents a Seebeck coefficient (e.g., thermoelectric sensitivity coefficient).

Figure 6A:
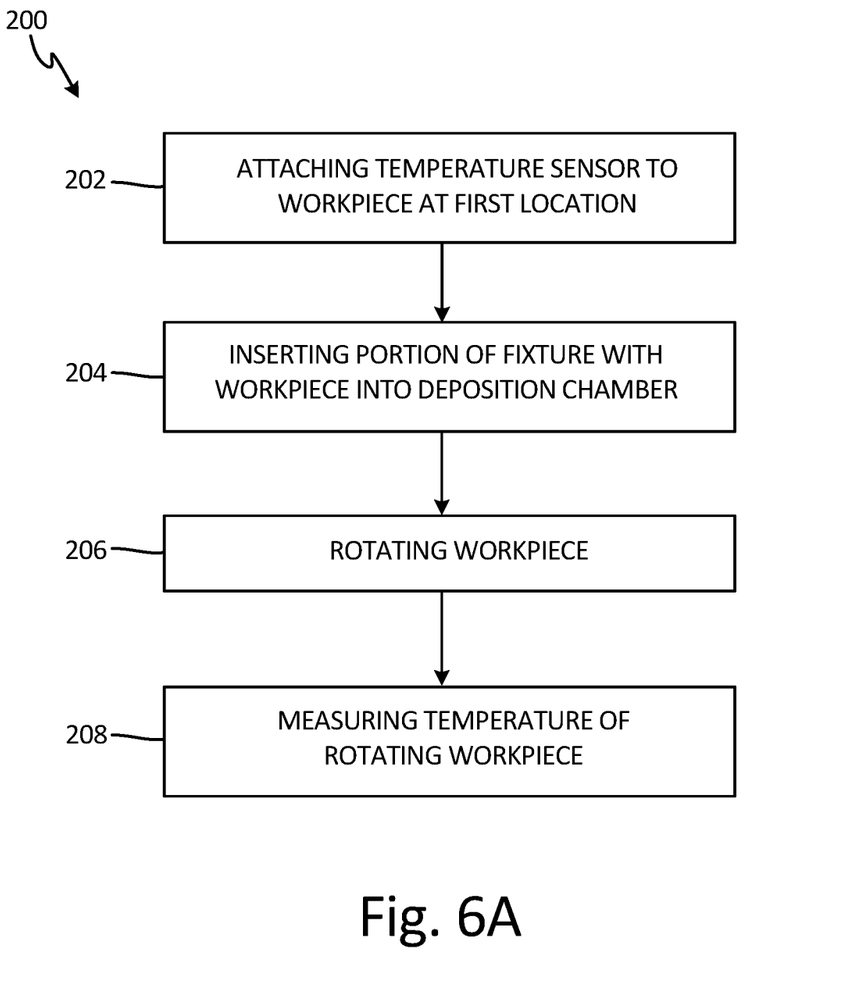
FIG. 6A is a flowchart of a first set of steps of a method of measuring temperature with the temperature sensor of the coating system.

FIG. 6A is a flowchart of a first set of steps of method 200 of measuring temperature with temperature sensor 108 of workpiece 58C. The first set of steps of method 200 includes steps 202-208.

Step 202 includes attaching temperature sensor 108 to workpiece 58C at a first location. Step 204 includes inserting a portion of fixture 56 with workpiece 58C into deposition chamber 48 of a vapor deposition system such as coating system 10. Step 206 includes rotating workpiece 58C. Step 208 includes measuring a temperature of workpiece 58C with temperature sensor 108 as workpiece 58C is rotated.

Figure 6B:
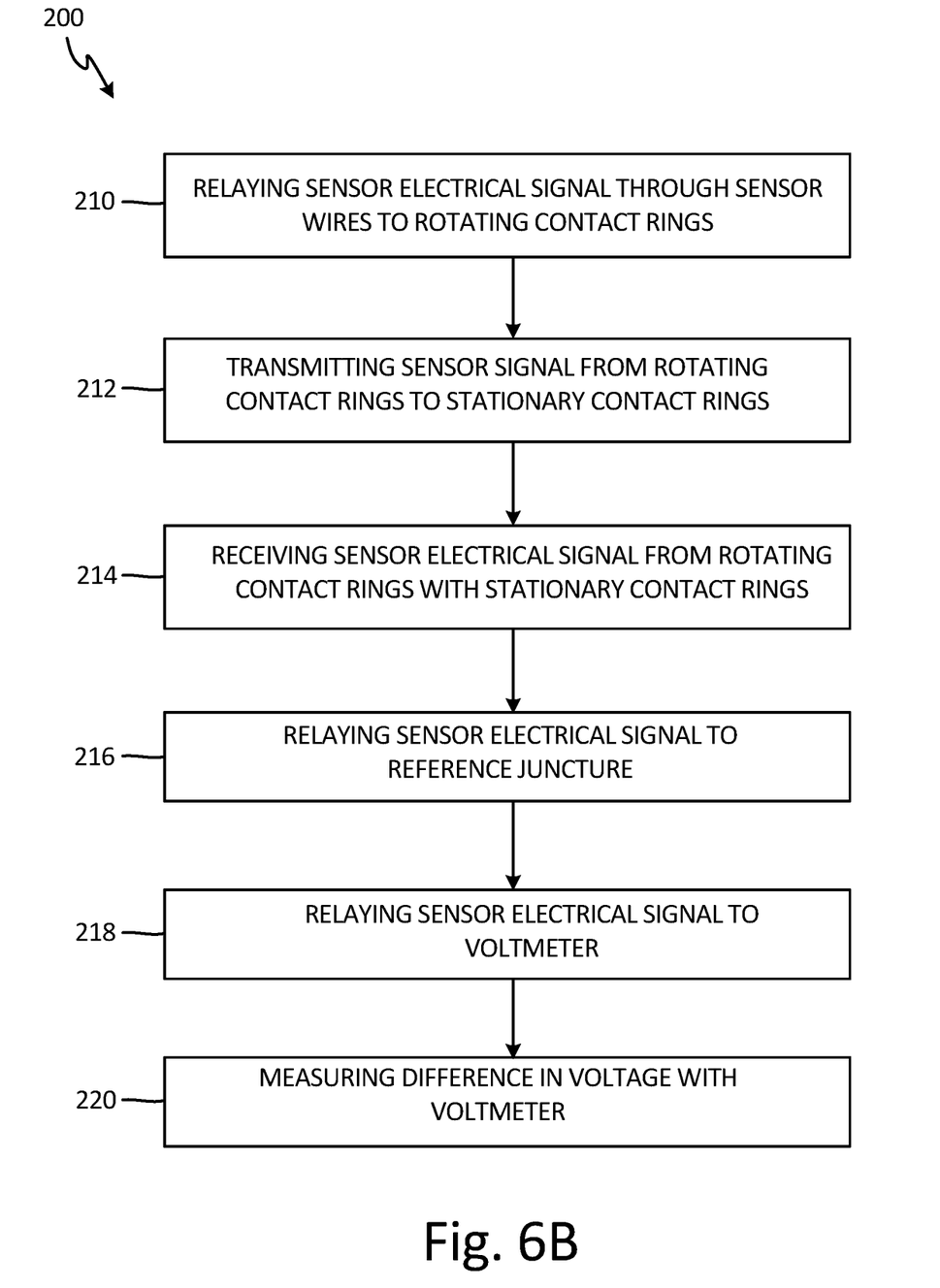
FIG. 6B is a flowchart of a second set of steps of a method of measuring temperature with the temperature sensor of the coating system.

FIG. 6B is a flowchart of a second set of steps of method 200 of measuring temperature with temperature sensor 108 of workpiece 58C. The second set of steps of method 200 includes steps 210-220.

Step 210 includes relaying a sensor electrical signal through sensor wires 110A and 110B to rotating contact rings 90A and 90B. The sensor electrical signal represents a voltage across temperature sensor 108. Step 212 includes transmitting the sensor electrical signal from rotating contact rings 90A and 90B to stationary contact rings 92A and 92B. Step 214 includes receiving the sensor electrical signal from rotating contact rings 90A and 90B with stationary contact rings 92A and 92B. Step 216 includes relaying the sensor electrical signal to a reference juncture such as reference sensor 112. Step 218 includes relaying the sensor electrical signal to a voltmeter. Step 220 includes measuring a difference in voltage across the voltmeter.

Figure 6C:
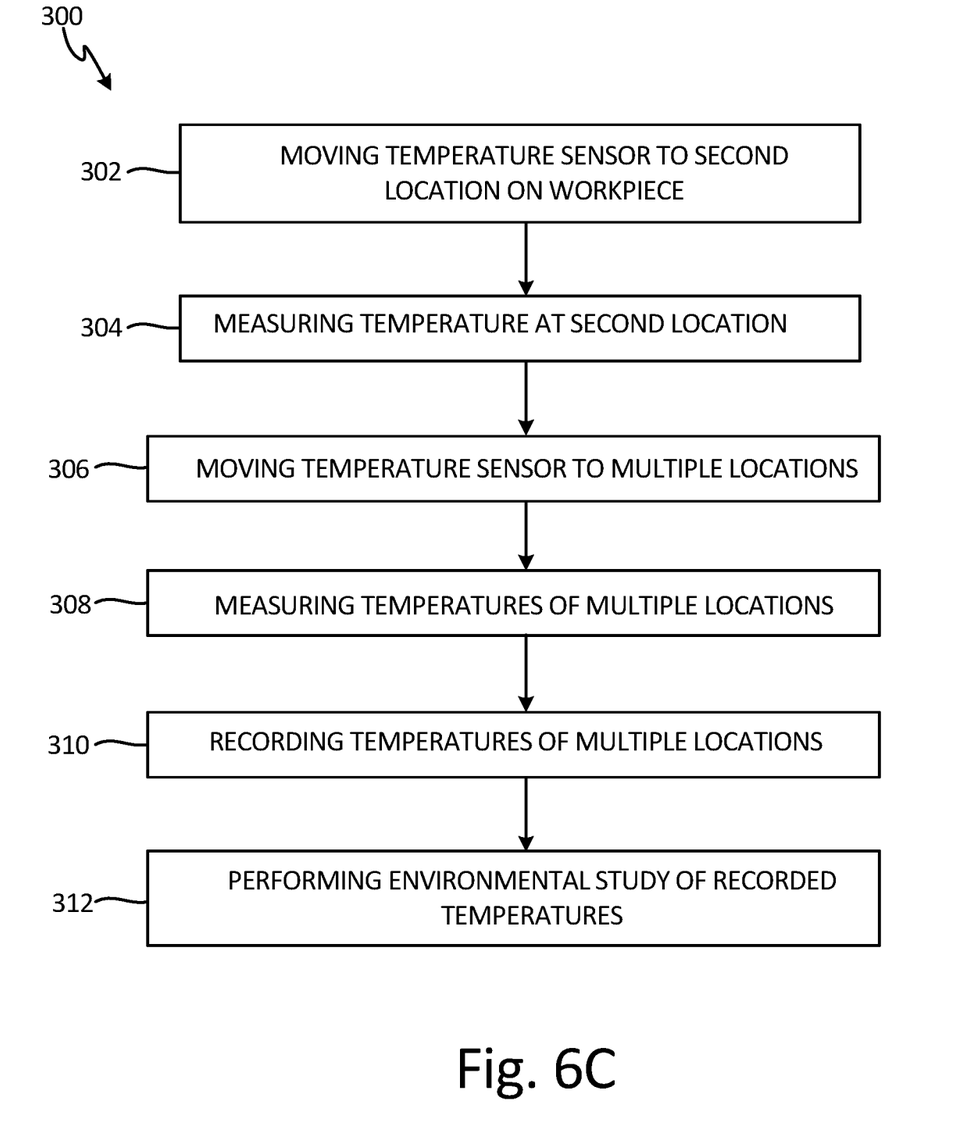
FIG. 6C is a flowchart of a method of performing an environmental study of temperatures measured with the temperature sensor.

FIG. 6C is a flowchart of method 300 of performing an environmental study with temperature sensor 108. Method 300 includes steps 302-312.

Step 302 includes moving temperature sensor 108 to a second location on workpiece 58C. Step 304 includes measuring a temperature of the second location. Step 306 includes moving temperature sensor 108 to multiple locations. Step 308 includes measuring temperatures of the multiple locations. Step 310 includes recording the temperatures of the multiple locations. Step 312 includes performing an environmental study of the recorded temperatures. In one non-limiting embodiment, step 312 can include conducting a temperature survey of workpiece 58C with an empirical analysis. In other non-limiting embodiments, other suitable and/or appropriate types of analysis can be used to study the thermodynamic characteristics and behavior of workpiece 58C.

Discussion of Possible Embodiments

The following are non-exclusive descriptions of possible embodiments of the present disclosure.

A system for measuring a temperature of a rotating workpiece comprises a deposition chamber, a crucible within the deposition chamber, an energy source, a drive mechanism, a temperature sensor, first and second sensor wires, a dynamic electrical connection, and a control system. The crucible is configured to hold a deposition feedstock material. The energy source is configured to heat the deposition feedstock material in the crucible so as to evaporate the deposition feedstock material. The drive mechanism includes a rotatable workpiece holder rotatably coupled to a stationary portion and that is configured to receive the workpiece and to rotate the workpiece proximate the crucible such that at least a portion of the evaporated deposition feedstock material can impinge the rotating workpiece. The temperature sensor is coupled to the rotatable workpiece holder and configured to contact and rotate with the workpiece held by the rotatable workpiece holder so as to sense the temperature of the workpiece during rotation and to generate a signal indicative of the sensed temperature. The first sensor wire and a second sensor wire are electrically connected to the temperature sensor. The dynamic electrical connection is configured to electrically communicate the signal indicative of the sensed temperature from the rotatable workpiece holder to the stationary portion. The control system is configured to measure, based on the electrically communicated signal indicative of the sensed temperature, the temperature of the workpiece during rotation.

The system of the preceding paragraph can optionally include, additionally and/or alternatively, any one or more of the following features, configurations and/or additional components.

A housing can be attached to the stationary portion. A cover can be configured to rotate relative to the housing, wherein the cover can be attached to the rotatable workpiece holder. A first rotating contact ring and/or a second rotating contact ring can be attached to the cover and can be electrically connected to the temperature sensor. A first stationary contact ring and/or a second stationary contact ring can be disposed in the housing and surround the first and second rotating contact rings respectively, wherein the first and second stationary contact rings can be configured to receive an electrical signal from the first and second rotating contact rings respectively.

The first and second rotating contact rings and the first and second stationary contact rings can comprise a slip-ring configuration.

A first reference wire and/or a second reference wire can be electrically connected to the first and second stationary contact rings respectively and can be configured to relay the electrical signal received from the first and second stationary contact rings to a reference sensor.

The temperature sensor can comprise a thermocouple.

The thermocouple can comprise a K-type thermocouple.

The system can be configured to measure a temperature of the workpiece as the workpiece is rotated.

The system can include multiple crucibles and energy sources, and multiple temperature sensors with sensor wires and dynamic electrical connections.

The system can comprise an electron beam physical vapor deposition system.

A method of measuring temperature comprises attaching a temperature sensor to a workpiece at a first location. A portion of a fixture with the workpiece is inserted into a deposition chamber of a vapor deposition system. The vapor deposition system includes a crucible within the deposition chamber, an energy source, a drive mechanism, a temperature sensor, first and second sensor wires, a dynamic electrical connection, a control system, and a contact ring assembly. The crucible is configured to hold a deposition feedstock material. The energy source is configured to heat the deposition feedstock material in the crucible so as to evaporate the deposition feedstock material. The drive mechanism includes a rotatable workpiece holder rotatably coupled to a stationary portion and that is configured to receive the workpiece and to rotate the workpiece proximate the crucible such that at least a portion of the evaporated deposition feedstock material can impinge the rotating workpiece. The temperature sensor is coupled to the rotatable workpiece holder and configured to contact and rotate with the workpiece held by the rotatable workpiece holder so as to sense the temperature of the workpiece during rotation and to generate a signal indicative of the sensed temperature. The first sensor wire and a second sensor wire are electrically connected to the temperature sensor. The dynamic electrical connection is configured to electrically communicate the signal indicative of the sensed temperature from the rotatable workpiece holder to the stationary portion. The control system is configured to measure, based on the electrically communicated signal indicative of the sensed temperature, the temperature of the workpiece during rotation. The contact ring assembly comprises a housing, a cover, first and second rotating contact rings, and first and second stationary contact rings. The workpiece is rotated. A temperature of the workpiece is measured with the temperature sensor as the workpiece is rotated.

The method of the preceding paragraph can optionally include, additionally and/or alternatively, any one or more of the following features, configurations and/or additional components.

A sensor electrical signal can be relayed through first and second sensor wires to the first and second rotating contact rings respectively, wherein the sensor electrical signal can represent a voltage across the temperature sensor. The sensor electrical signal can be transmitted from the first and second rotating contact rings to the first and second stationary contact rings respectively. The sensor electrical signal can be received from the first and second rotating contact rings with the first and second stationary contact rings respectively. The sensor electrical signal can be relayed to a reference juncture. The sensor electrical signal can be relayed to a reference voltmeter. A difference in voltage can be measured with the voltmeter.

The temperature sensor can be moved to a second location on the workpiece. A temperature of the second location can be measured.

The temperature sensor can be moved to multiple locations. Temperatures of the multiple locations can be measured. The temperatures of the multiple locations can be recorded. An environmental study of the recorded temperatures can be performed.

The system can include multiple crucibles and energy sources, and multiple temperature sensors with sensor wires and dynamic electrical connections.

A fixture for an electron beam physical vapor deposition system comprises an arm, a rake extending from the arm, a crown gear bearing assembly, a workpiece holder, a thermocouple with a first sensor wire and a second sensor wire, and a contact ring assembly. The crown gear bearing assembly is attached to and rotatably engaged with the rake and includes a stationary portion and a rotating portion configured to rotate relative to the stationary portion. The workpiece holder is configured to retain the workpiece within the deposition chamber. The workpiece holder is attached to the rotating portion of the crown gear bearing assembly and is configured to rotate with the rotating portion of the crown gear bearing assembly relative to the stationary portion of the crown gear bearing assembly. The thermocouple is configured to rotate with the workpiece holder relative to the stationary portion of the crown gear bearing assembly. The contact ring assembly comprises a housing, a cover, first and second rotating contact rings, and first and second stationary contact rings. The housing is attached to at least one of the arm and the rake. The cover is attached to the rotating portion of the crown gear bearing assembly. The first and second rotating contact rings are attached to the cover and electrically connected to the thermocouple. The first and second stationary contact rings are disposed in the housing and surrounding the rotating ring. The first and second stationary contact rings are configured to receive an electrical signal from the first and second rotating contact rings, respectively. The first and second rotating contact rings and the first and second stationary contact rings comprise a slip-ring configuration.

The system of the preceding paragraph can optionally include, additionally and/or alternatively, any one or more of the following features, configurations and/or additional components.

The thermocouple can comprise a K-type thermocouple.

A first reference wire and a second reference wire can be electrically connected to the first and second stationary contact rings respectively and can be configured to relay the electrical signal received from the first and second stationary contact rings to a reference sensor.

The thermocouple can be configured to measure a temperature of the workpiece as the workpiece is rotated.

The system can include multiple crucibles and energy sources, and multiple temperature sensors with sensor wires and dynamic electrical connections.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A fixture for an electron beam physical vapor deposition system, the fixture comprising:
   an arm;
   a rake extending from the arm;
   a crown gear bearing assembly attached to and rotatably engaged with the rake,
   wherein the crown gear bearing assembly comprises:
   a stationary portion; and
   a rotating portion configured to rotate relative to the stationary portion;
   a workpiece holder configured to retain the workpiece within a deposition chamber, wherein the workpiece holder is attached to the rotating portion of the crown gear bearing assembly and is configured to rotate with the rotating portion of the crown gear bearing assembly relative to the stationary portion of the crown gear bearing assembly;

a thermocouple with a first sensor wire and a second sensor wire, the thermocouple configured to rotate with the workpiece holder relative to the stationary portion of the crown gear bearing assembly; and a contact ring assembly comprising:
  a housing attached to at least one of the arm and the rake;
  a cover configured to rotate relative to the housing, wherein the cover is attached to the rotating portion of the crown gear bearing assembly;
  a first rotating contact ring and a second rotating contact ring attached to the cover and electrically connected to the thermocouple via the first and second sensor wires;
  a first stationary contact ring and a second stationary contact ring disposed in the housing and surrounding the first and second rotating rings respectively, wherein the first and second stationary contact rings are configured to receive an electrical signal from the first and second rotating contact rings respectively, further wherein the first and second rotating contact rings and the first and second stationary contact rings comprise a slip-ring configuration; and
  a first reference wire and a second reference wire electrically connected to the first and second stationary contact rings respectively and configured to relay the electrical signal received from the first and second stationary contact rings to a reference sensor.

2. The fixture of claim 1, wherein the thermocouple comprises a K-type thermocouple.

3. The fixture of claim 1, wherein the thermocouple is configured to measure a temperature of the workpiece as the workpiece is rotated.

* * * * *